(12) United States Patent
Hayashi et al.

(10) Patent No.: US 11,864,314 B2
(45) Date of Patent: Jan. 2, 2024

(54) PATTERNED FIBER SUBSTRATE

(71) Applicants: KURARAY CO., LTD., Kurashiki (JP); OSAKA RESEARCH INSTITUTE OF INDUSTRIAL SCIENCE AND TECHNOLOGY, Izumi (JP)

(72) Inventors: Kohei Hayashi, Osaka (JP); Soichi Obata, Okayama (JP); Yasuhiro Shirotani, Tokyo (JP); Masashi Nitani, Izumi (JP); Mayumi Uno, Izumi (JP); Kazuki Maeda, Izumi (JP)

(73) Assignees: KURARAY CO., LTD., Kurashiki (JP); OSAKA RESEARCH INSTITUTE OF INDUSTRIAL SCIENCE AND TECHNOLOGY, Izumi (JP)

( * ) Notice: Subject to any disclaimer, the term of this patent is extended or adjusted under 35 U.S.C. 154(b) by 393 days.

(21) Appl. No.: 17/417,506

(22) PCT Filed: Dec. 18, 2019

(86) PCT No.: PCT/JP2019/049616
§ 371 (c)(1),
(2) Date: Jun. 23, 2021

(87) PCT Pub. No.: WO2020/137742
PCT Pub. Date: Jul. 2, 2020

(65) Prior Publication Data
US 2022/0117083 A1    Apr. 14, 2022

(30) Foreign Application Priority Data

Dec. 26, 2018 (JP) ................................ 2018-243509
May 17, 2019 (JP) ................................ 2019-093650

(51) Int. Cl.
*H05K 1/03*    (2006.01)
*D06M 10/00*    (2006.01)
(Continued)

(52) U.S. Cl.
CPC .......... *H05K 1/038* (2013.01); *D06M 10/001* (2013.01); *D06M 23/16* (2013.01); *H05K 3/28* (2013.01);
(Continued)

(58) Field of Classification Search
CPC ...................... H05K 1/038; H05K 2201/0275
See application file for complete search history.

(56) References Cited

U.S. PATENT DOCUMENTS

2003/0107465 A1    6/2003  Hiraoka et al.
2006/0257633 A1*  11/2006  Inoue .................. C23C 18/1608
                                                                427/299
(Continued)

FOREIGN PATENT DOCUMENTS

CN    204697317 U    10/2015
CN    105689026 B    10/2017
(Continued)

OTHER PUBLICATIONS

International Preliminary Report on Patentability and Written Opinion dated Jun. 16, 2021 in PCT/JP2019/049616 (with English translation), 17 pages.

(Continued)

*Primary Examiner* — Sherman Ng
(74) *Attorney, Agent, or Firm* — Element IP, PLC (57) ABSTRACT

The present invention relates to a patterned fiber substrate comprising: a fiber substrate; and a pattern consisting of a functional material and formed on the fiber substrate, wherein at least a part of the functional material that constitutes the pattern is present in inside of the fiber substrate, the fiber substrate has a contact angle of 100 to 170° with pure water on its surface, and the pattern has a narrowest line width of 1 to 3000 μm.

17 Claims, 3 Drawing Sheets

(51) Int. Cl.
*D06M 23/16* (2006.01)
*H05K 3/28* (2006.01)
*H05K 3/46* (2006.01)

(52) U.S. Cl.
CPC ... *H05K 3/4644* (2013.01); *H05K 2201/0275* (2013.01)

(56) References Cited

U.S. PATENT DOCUMENTS

| | | | |
|---|---|---|---|
| 2008/0233280 A1* | 9/2008 | Blanchet | B82Y 10/00 428/44 |
| 2009/0008142 A1* | 1/2009 | Shimizu | H05K 1/036 428/209 |
| 2013/0144131 A1 | 6/2013 | Wang et al. | |
| 2016/0374615 A1 | 12/2016 | Tsukada et al. | |
| 2018/0147404 A1 | 5/2018 | Nagel | |

FOREIGN PATENT DOCUMENTS

| | | |
|---|---|---|
| CN | 108517696 A | 9/2018 |
| CN | 108654709 A | 10/2018 |
| JP | H09-87964 A | 3/1997 |
| JP | 2003221783 A | 8/2003 |
| JP | 2017147085 A | 8/2017 |
| JP | 2017208492 A | 11/2017 |
| KR | 10-20140044429 A | 4/2014 |
| WO | WO-2009075550 A2 | 6/2009 |
| WO | WO-2015115441 A1 | 8/2015 |

OTHER PUBLICATIONS

International Search Report dated Mar. 17, 2020 in PCT/JP2019/049616 (with English translation), 7 pages.
Extended European Search Report dated Sep. 2, 2022 in Patent Application No. 19903551.0, 12 pages.

* cited by examiner

PATTERNED FIBER SUBSTRATE

TECHNICAL FIELD

The present invention relates to a patterned fiber substrate and a method for producing the same.

BACKGROUND ART

For the purpose of imparting various functions (for example, conductivity, heat generation properties, and water repellency) to a substrate (for example, a fiber substrate or a film substrate), a thin film or a pattern consisting of a functional material is formed on the surface of the substrate.

For example, Patent Document 1 discloses a planar heating element having an average air permeability of 3 to 50 $cm^3/(cm^2 \cdot s)$. The planar heating element includes a fabric, and two or more independent patterned electrodes made of a metal film having a thickness of 0.1 to 10 μm, and a heat-generating film connecting the two or more patterned electrodes, the patterned electrodes and the heat-generating film being provided on one surface of the fabric. The document also proposes that a conductive ink is screen-printed on the fabric to produce a fabric with conductive wiring. It is, however, difficult to form a fine wiring pattern on the substrate by such a method. In order to solve this problem, for example, Patent Document 2 discloses a wiring structure including a fibrous porous substrate, a first underlayer formed on one surface of the fibrous porous substrate, and a first conductive layer provided on the first underlayer and having a penetrating connection portion that penetrates the fibrous porous substrate. The document also proposes that a conductive yarn is wound into the fiber substrate.

PRIOR ART DOCUMENTS

Patent Documents

Patent Document 1: JP-A-2017-147085
Patent Document 2: JP-A-2017-208492

SUMMARY OF THE INVENTION

Problems to be Solved by the Invention

However, according to the study made by the present inventors, the wiring structure described in Patent Document 2 has problems that the production method is complicated due to the presence of the underlayer for preventing the spreading of the conductive ink, and that thinness (lightness) of the wiring structure is impaired. In addition, the method of weaving the conductive yarn into the fiber substrate has low degree of freedom in the pattern design. Further, when a high-viscosity conductive ink that is less likely to cause bleeding is screen-printed in order to form a fine wiring pattern, the spreading of the conductive ink may be slightly improved. However, the method has a problem that the wiring pattern is easy to form only on the surface of the substrate or in the vicinity of the surface of the substrate, so that such a patterned substrate has low bending resistance.

Therefore, an object to be solved by the present invention is to provide a patterned fiber substrate that can be produced by a simpler method using a wide range of functional material solutions or dispersions, that can also have a fine pattern, and that has excellent bending resistance.

Further, a multilayer circuit board conventionally used in general requires the formation of a via hole in the direction perpendicular to the substrate and the electrical connection between the multiple layers through this via hole. This requires a step of forming the via hole, and in a multilayer circuit board with strict dimensional restrictions, uniform application of a conductive material (for example, a metal powder-containing material) to the inner surface of the via hole with a very small diameter. In particular, applying a conductive material to the inner surface of a via hole having a large aspect ratio (depth of the via hole/diameter of the via hole) requires a complicated process, and an advanced technique for that purpose.

Therefore, another object to be solved by the present invention is to provide a multilayer circuit board capable of solving the above-mentioned conventional problems.

Solutions to the Problems

In order to solve the above-mentioned problems, the present inventors repeatedly studied the patterned fiber substrate in detail, and completed the present invention.

Specifically, the present invention includes the following preferred embodiments.

[1] A patterned fiber substrate comprising:
a fiber substrate; and
a pattern consisting of a functional material and formed on the fiber substrate,
wherein at least a part of the functional material that constitutes the pattern is present in inside of the fiber substrate,
the fiber substrate has a contact angle of 100 to 170° with pure water on its surface, and
the pattern has a narrowest line width of 1 to 3000 μm.
[2] The patterned fiber substrate according to the item [1], wherein the fiber substrate has an air permeability of 400 $cm^3/cm^2 \cdot s$ or less.
[3] The patterned fiber substrate according to the item [1] or [2], wherein fibers that constitute the fiber substrate have an average fiber diameter of 0.1 to 20 μm.
[4] The patterned fiber substrate according to any one of the items [1] to [3], wherein the fiber substrate is a nonwoven fabric.
[5] The patterned fiber substrate according to any one of the items [1] to [4], wherein at least a part of the functional material that constitutes the pattern reaches a depth of 1 μm or more from a surface of the fiber substrate.
[6] The patterned fiber substrate according to any one of the items [1] to [5], wherein the fiber substrate has a double roughness structure on its surface.
[7] The patterned fiber substrate according to any one of the items [1] to [6], wherein the pattern is a conductive pattern.
[8] The patterned fiber substrate according to the item [7], comprising two or more conductive patterns formed on one surface of the patterned fiber substrate, wherein at least two of the conductive patterns are electrically connected together by being partially in contact with each other or by another conductive pattern.
[9] The patterned fiber substrate according to the item [7], comprising one or more conductive patterns (A) formed on one surface of the patterned fiber substrate, and one or more conductive patterns (B) formed on another surface of the patterned fiber substrate, wherein at least one of the conductive patterns (A) and at least one of the conductive patterns (B) are electrically connected together by being partially in contact with each other or by another conductive pattern.
[10] A patterned fiber substrate laminate comprising a plurality of patterned fiber substrates, wherein at least two of the plurality of patterned fiber substrates are each the patterned fiber substrate according to the item [7], each of the at least two patterned fiber substrates includes one or more conductive patterns formed on one surface of the patterned fiber substrate, or one or more conductive patterns formed on each of both surfaces of the patterned fiber substrate, and at least two conductive patterns included in separate patterned fiber substrates are electrically connected together by being partially in contact with each other or by another conductive pattern.

[11] The patterned fiber substrate according to any one of the items [1] to [9], comprising a protective material on at least a part of at least one surface of the patterned fiber substrate.

[12] The patterned fiber substrate laminate according to the item [10], comprising a protective material on at least a part of at least one surface of the patterned fiber substrate laminate.

[13] A method for producing the patterned fiber substrate according to any one of the items [1] to [9], the method comprising the steps of:

(i) forming a lyophilic region on the fiber substrate and in the inside of the fiber substrate;

(ii) providing a solution or a dispersion of the functional material to the formed lyophilic region; and (iii) removing a solvent or a dispersion medium from the provided solution or dispersion.

[14] The production method according to the item [13], wherein in step (i), the lyophilic region is formed by irradiating outside of the fiber substrate and the inside of the fiber substrate with ultraviolet light.

[15] The production method according to the item [13] or [14], wherein in step (i), the lyophilic region is formed on the fiber substrate that is not subjected to a liquid repellent treatment and in the inside of the fiber substrate that is not subjected to a liquid repellent treatment.

[16] The production method according to any one of the items [13] to [15], further comprising the step of:

(iv) forming a protective material on at least a part of at least one surface of the patterned fiber substrate obtained in step (iii).

[17] The production method according to the item [16], wherein in step (iv), the protective material is formed by bonding of the protective material in sheet shape to the patterned fiber substrate, applying or electrodepositing a solution or a dispersion of the protective material to the patterned fiber substrate, and subsequently removing a solvent or a dispersion medium, or dipping the patterned fiber substrate into a solution or a dispersion of the protective material, and subsequently removing a solvent or a dispersion medium.

Effects of the Invention

According to the present invention, it is possible to provide a patterned fiber substrate that can be produced by a simpler method using a wide range of functional material solutions or dispersions, that can also have a fine pattern, and that has excellent bending resistance. Further, according to the present invention, it is possible to provide a multilayer circuit board capable of solving the conventional problems.

EMBODIMENTS OF THE INVENTION

Hereinafter, embodiments of the present invention is described, but the present invention is not limited to the embodiments.

[Patterned Fiber Substrate]

The patterned fiber substrate of the present invention comprises a fiber substrate, and a pattern consisting of a functional material and formed on the fiber substrate. In the patterned fiber substrate of the present invention, at least a part of the functional material constituting the pattern is present in inside of the fiber substrate, the fiber substrate has a contact angle of 100 to 170° with pure water on its surface, and the pattern has a narrowest line width of 1 to 3000 μm.

<Fiber Substrate>

In the present invention, the fiber substrate may be any fiber substrate as long as the fiber substrate has a contact angle with pure water of 100 to 170° on its surface. The surface of the fiber substrate has liquid repellency since it has a contact angle of 100° or more and 170° or less. Further, since the surface of the fiber substrate and the inside of the fiber substrate are formed from the same fibers and have the same fiber substrate form, the inside of the fiber substrate also has sufficient liquid repellency for providing a fine pattern. In the present invention, the "fine pattern" means a pattern with little or no bleeding. When the contact angle is smaller than 100°, it is difficult to impart a fine pattern to the patterned fiber substrate, whereas it is difficult to prepare a fiber substrate having a contact angle larger than 170°. From the viewpoint of ease of forming a finer pattern, the contact angle is preferably 105° or more, more preferably 115° or more, and particularly preferably 120° or more, and is, for example, 160° or less, 150° or less, or 140° or less. The contact angle can be adjusted within the above-mentioned ranges by the type or average fiber diameter of the fibers constituting the substrate, the method for producing the fiber substrate, the processing treatment on the fiber substrate, or the like. The contact angle can be measured by the method described in the section of EXAMPLES described later.

The fibers constituting the fiber substrate may be non-hydrophilic fibers, for example, polyolefin fibers (for example, polyethylene fibers and polypropylene fibers), polyester fibers [for example, polyethylene terephthalate fibers, polybutylene terephthalate fibers, and liquid crystal polyester (liquid crystal polymer) fibers], polyamide fibers (for example, polyamide 6 fibers and polyamide 66 fibers), polyurethane-based fibers (for example, polyester polyol urethane fibers), or a combination thereof. The fibers may also be hydrophilic fibers [for example, vinyl alcohol-based fibers such as ethylene-vinyl alcohol copolymers, polylactic acid-based fibers such as polylactic acid, (meth)acrylic-based copolymer fibers containing a (meth)acrylamide unit, cellulose fibers such as pulp, rayon fibers, and acetate fibers, or a combination thereof] that are hydrophobized by a publicly-known technique (for example, using a fluorine compound, silicone or the like). The hydrophobization may be hydrophobization to either the fibers or the fiber substrate.

Of these, use of one type of the non-hydrophilic fiber or a combination of two or more types of the non-hydrophilic fibers is preferable from the viewpoint of high productivity and ease of obtaining a larger contact angle or higher liquid repellency, and polybutylene terephthalate fibers, liquid crystal polymer fibers, and combinations thereof are more preferable from the viewpoint of ease of obtaining a larger contact angle or higher liquid repellency.

Examples of the form of the fibers include monofilaments, multifilaments, spun yarns, and covered yarns. Multifilaments are preferable from the viewpoint of ease of obtaining a larger contact angle or higher liquid repellency as well as of productivity.

The average fiber diameter of the fibers is preferably 0.1 to 20 μm, more preferably 0.5 to 10 μm, and particularly preferably 1 to 8 μm from the viewpoint of ease of obtaining a larger contact angle or higher liquid repellency. When the average fiber diameter of the fibers is as small as 20 μm or less, the fiber substrate easily tends to have a double roughness structure described later on its surface, and as a result, the surface of the fiber substrate easily tends to have high liquid repellency. Even when the contact angle value is relatively small (for example, less than 115°), when the average fiber diameter of the fibers is within the above-mentioned ranges, a finer pattern can be formed on the fiber substrate, and therefore, the patterned fiber substrate can also have a finer pattern. The average fiber diameter of the fibers can be determined in accordance with JIS L 1015 "Test methods for man-made staple fibres (8.5.1)".

Examples of the form of the fiber substrate include woven fabrics, knitted fabrics, nonwoven fabrics, felt, and sponges. The fiber substrate is preferably a nonwoven fabric from the viewpoint of ease of obtaining a larger contact angle or higher liquid repellency.

The air permeability of the fiber substrate is preferably 400 cm$^3$/cm$^2$·s or less, more preferably 200 cm$^3$/cm$^2$·s or less, and particularly preferably 100 cm$^3$/cm$^2$·s or less from the viewpoint of ease of obtaining a larger contact angle or higher liquid repellency. The air permeability of the fiber substrate is usually 1 cm$^3$/cm$^2$·s or more, and preferably 5 cm$^3$/cm$^2$·s or more. When the air permeability of the fiber substrate is as small as 400 cm$^3$/cm$^2$·s or less, in the method for producing the patterned fiber substrate described later, the solution or dispersion of the functional material provided to the lyophilic region of the fiber substrate is difficult to spread. Therefore, even when the contact angle value is relatively small (for example, less than 115°), when the air permeability of the fiber substrate is equal to or less than the above-mentioned upper limits, a finer pattern can be formed on the fiber substrate, and therefore, the patterned fiber substrate can also have a finer pattern. The air permeability of the fiber substrate can be adjusted within the above-mentioned ranges by the selection of the form or average fiber diameter of the fibers constituting the fiber substrate, the processing treatment on the fiber substrate, or the like. The air permeability can be measured in accordance with the Frazier method of JIS L 1913:2010 "Test methods for nonwovens, air permeability".

The fiber substrate may have a basis weight of, for example, 1 to 100 g/m$^2$, and preferably has a basis weight of 2 to 50 g/m$^2$. When the basis weight is within the above-mentioned ranges, it is easy to obtain a larger contact angle or higher liquid repellency, the preferable air permeability, or flexibility. The basis weight of the fiber substrate can be adjusted within the above-mentioned ranges by the selection of the form or average fiber diameter of the fibers constituting the fiber substrate, the processing treatment on the fiber substrate, or the like. The basis weight can be measured in accordance with JIS P 8124 "Paper and board-Determination of grammage".

The fiber substrate may have a thickness of, for example, 20 to 1000 μm, and preferably has a thickness of 40 to 1000 μm. When the thickness is within the above-mentioned ranges, it is easy to achieve lightness or flexibility. The thickness can be measured with a thickness gauge.

If necessary, the fiber substrate may be subjected to at least one publicly-known post-processing or post-treatment, for example, at least one of calendering, embossing, a spunlace (water needle) treatment, dyeing, raising, a liquid repellent treatment (including a water repellent treatment), flameproofing, flame retarding, negative ion generating processing and the like. From the viewpoint of ease of obtaining a larger contact angle or higher liquid repellency, it is preferable that the fiber substrate is subjected to raising or a liquid repellent treatment, but not to calendering. When a sufficient or larger contact angle or liquid repellency is already achieved by selecting the form of the fiber substrate, the type or average fiber diameter of the fibers constituting the fiber substrate, or the like, it is preferable that the fiber substrate is not subjected to raising or a liquid repellent treatment from the viewpoint of productivity.

As described above, the contact angle can be adjusted to a desired value by selecting the form of the fiber substrate, the type or average fiber diameter of the fibers constituting the fiber substrate, or the like, while it may depend on the structure of the surface of the fiber substrate. Therefore, in a preferred embodiment of the present invention, the fiber substrate has a double roughness structure on its surface from the viewpoint of ease of obtaining a larger contact angle or higher liquid repellency. In the present invention, the double roughness structure means a periodic microstructure capable of exhibiting the so-called lotus effect. Due to the lotus effect provided by the microstructure and chemical properties of the surface of the fiber substrate, in this embodiment, the surface of the fiber substrate can have a larger contact angle with pure water or higher liquid repellency. The double roughness structure of the surface of the fiber substrate can be confirmed indirectly, for example, by the contact angle with pure water of the surface of the fiber substrate which is significantly larger (for example, larger by 5° or more) than the inherent contact angle with pure water of the fibers constituting the fiber substrate. The fiber substrate can have a double roughness structure on its surface by the selection of the average fiber diameter and the like of the fibers constituting the fiber substrate, the selection of the method for producing the fiber substrate, the selection of the post-processing or post-treatment, or the like.

The fiber substrate can be produced by a publicly-known or conventional method.

When the fiber substrate is a nonwoven fabric, the nonwoven fabric can be produced using, for example, one or more types of the above-mentioned fibers by an air-through method, a spunbond method, a needle punch method, a melt-blown method, an electrostatic spinning method, a carding method, a thermal fusion method, a water-jet entangling method, or a solvent bonding method. Of these, it is preferable to adopt the electrostatic spinning method or the melt-blown method from the viewpoint of ease of adjusting the average fiber diameter of the fibers constituting the fiber substrate within the preferable ranges, and it is more preferable to adopt the melt-blown method from the viewpoint of ease of obtaining a larger contact angle or higher liquid repellency. If necessary, the obtained nonwoven fabric may be subjected to the publicly-known post-processing or post-treatment as described above.

The fiber substrate used may also be a commercially available product, and examples of the commercially available product include VECRUS (registered trademark) manufactured by Kuraray Kuraflex Co., Ltd.

<Pattern>

The patterned fiber substrate of the present invention comprises a pattern consisting of a functional material and formed on the fiber substrate. The narrowest line width of the pattern is 1 to 3000 µm. In the patterned fiber substrate of the present invention, the degree of freedom in the pattern design is not limited since at least a part of the pattern has the very narrow line width as described above. As a result, the patterned fiber substrate of the present invention can also have a fine pattern. The narrowest line width of the pattern is preferably 3 to 2000 µm, and more preferably 5 to 1000 µm. The line width can be adjusted by adjusting the width of the lyophilic region formed on the fiber substrate and in the inside of the fiber substrate (specifically, the width of a part of a patterned photomask from which a light-shielding film has been removed) in the method for producing the patterned fiber substrate described later. The line width of the pattern can be measured by observation with a stereomicroscope.

Further, in the present invention, at least a part of the functional material constituting the pattern is present in the inside of the fiber substrate. This is because, since the substrate is a fiber substrate, unlike the case where the substrate is, for example, a film, at least a part of the functional material can penetrate into the inside of the fiber substrate during formation of the pattern on the fiber substrate. Since at least a part of the functional material is present in the inside of the fiber substrate, the patterned fiber substrate of the present invention can have excellent bending resistance. Further, the excellent bending resistance can be well exhibited even in a portion where the pattern has a narrow line width.

In a preferred embodiment, at least a part of the functional material constituting the pattern reaches a depth of 1 µm or more, preferably 5 µm or more, and more preferably 10 µm or more (for example, 20 µm or more, 40 µm or more, 100 µm or more, or 180 µm or more) from the surface of the fiber substrate. The deeper the functional material reaches from the surface of the fiber substrate, the easier it is to achieve better bending resistance. The upper limit of the depth coincides with the thickness of the fiber substrate. The depth can be adjusted by adjusting the depth of the lyophilic region formed in the inside of the fiber substrate (specifically, the depth of the lyophilic region in the thickness direction of the fiber substrate) in the method for producing the patterned fiber substrate described later. The depth can be measured by the method described in the section of EXAMPLES described later.

As described in the method for producing the patterned fiber substrate described later, the type of the pattern in the present invention is not particularly limited as long as the pattern contains a functional material capable of being dissolved in a solvent to form a solution or capable of being dispersed in a dispersion medium to form a dispersion. Examples of the functional material include conductive materials, semiconductive materials, catalyst materials, pigments, dyes, magnetic materials, electrostatic shielding materials, fluorescent materials, light-absorbing materials, dielectric materials, ferroelectric materials, piezoelectric materials, and combinations thereof. In addition, in the present invention, examples of the type of the pattern corresponding to the above-mentioned functional materials include conductive patterns, semiconductive patterns, catalyst patterns, colored patterns, dyed patterns, magnetic patterns, electrostatic shielding patterns, fluorescent patterns, light-absorbing patterns, dielectric patterns, ferroelectric patterns, piezoelectric patterns, and combinations thereof. That is, the patterned fiber substrate of the present invention can have a very wide variety of different patterns.

When the pattern is a conductive pattern, the functional material constituting the pattern is a conductive material. The conductive material is based on, for example, a conductive polymer such as poly(3,4-ethylenedioxythiophene) doped with polystyrene sulfonic acid (PPS) (i.e. PEDOT-PSS) and PEDOT doped with p-toluenesulfonic acid (TsO) (i.e. PEDOT-TsO), metal nanoparticles such as silver nanoparticles and copper nanoparticles, metal nanowires such as silver nanowires and copper nanowires, a carbon material such as carbon nanotubes, graphene, and graphite, metal-coated particles or metal-coated fibers such as metal-plated polymer particles or metal-plated glass fibers, or a mixed material of these. Of these, the conductive material is preferably based on metal nanoparticles, metal nanowires, or a mixed material thereof from the viewpoint of ease of obtaining good conductivity, and is more preferably based on copper nanoparticles, copper nanowires, or a mixed material thereof from the viewpoint of economy.

Further, the conductive pattern may be a pattern having metal plating applied by a method such as electroless plating on the surface of a pattern formed with the conductive materials as described above.

In one embodiment of the present invention, the patterned fiber substrate comprises two or more conductive patterns formed on one surface of the patterned fiber substrate, and at least two of the conductive patterns are electrically connected together by being partially in contact with each other or by another conductive pattern.

Further, in another embodiment of the present invention, the patterned fiber substrate includes one or more conductive patterns (A) formed on one surface of the patterned fiber substrate, and one or more conductive patterns (B) formed on another surface of the patterned fiber substrate, and at least one of the conductive patterns (A) and at least one of the conductive patterns (B) are electrically connected together by being partially in contact with each other or by another conductive pattern. The patterned fiber substrate according to either of the above-mentioned embodiments is hereinafter also referred to as a "patterned fiber substrate in which electrical conduction between front and back surfaces is ensured". In the above-mentioned embodiment, it is also possible to adopt a form in which the conductive pattern (A) and the conductive pattern (B) are not electrically connected together in an idling state (a state in which no force or deformation is applied), and are electrically connected together only when force or deformation is applied to the fiber substrate. For example, it is possible to form a so-called "bending switch", with which at least one of the conductive patterns (A) and at least one of the conductive patterns (B)

are electrically connected together by bending of the fiber substrate so that at least one of the conductive patterns (A) and at least one of the conductive patterns (B) partially come into contact with each other, or by another conductive pattern.

The present invention is also directed to a patterned fiber substrate laminate comprising a plurality of patterned fiber substrates, wherein at least two of the plurality of patterned fiber substrates are each the patterned fiber substrate in which the pattern is a conductive pattern, each of the at least two patterned fiber substrates includes one or more conductive patterns formed on one surface of the patterned fiber substrate, or one or more conductive patterns formed on each of both surfaces of the patterned fiber substrate, and at least two conductive patterns included in separate patterned fiber substrates am electrically connected together by being partially in contact with each other or by another conductive pattern.

The patterned fiber substrates in which the pattern is a conductive pattern may be laminated adjacent to each other or may be laminated without being adjacent to each other.

In one embodiment of the present invention, the plurality of patterned fiber substrates constituting the patterned fiber substrate laminate are all patterned fiber substrates in which the pattern is a conductive pattern.

One or more of the premed fiber substrates constituting the patterned fiber substrate laminate may each be a patterned fiber substrate having a protective material on at least a part of at least one surface of the patterned fiber substrate, which is described later.

As described later, in the method for producing the patterned fiber substrate in which the pattern is a conductive pattern, an electrical connection portion between the conductive pattern (A) and the conductive pattern (B) can be formed by a very simple method of making a conductive ink penetrate into the fiber substrate. In addition, it is possible to establish electrical conduction between front and back surfaces of the patterned fiber substrate without forming a hole such as a via hole. Further, since this configuration does not require the area corresponding to the hole portion of the via hole, it is possible to reduce the space required for the electrical connection portion and provide a more efficient circuit design.

It is possible to electrically connect an electronic component to the conductive pattern in the patterned fiber substrate of the present invention. Such an electronic component is not particularly limited, and examples thereof include transistors, diodes, operational amplifiers, resistors, capacitors, coils, electrical condensers, integrated circuits, light emitting elements, communication elements, power supply elements such as batteries and power generation elements, and sensors.

When the pattern is a catalyst pattern, the functional material constituting the pattern is a catalyst material. The catalyst material is based on, for example, an electroless plating catalyst such as a palladium-tin mixed colloid and a silver-tin mixed colloid. Of these, the catalyst material is preferably based on a palladium-tin mixed colloidal liquid from the viewpoint of ease of obtaining satisfactory plated coating.

<Protective Material>

It is preferable to provide, on at least a part of the surface of the patterned fiber substrate or the patterned fiber substrate laminate where the functional material is exposed, a protective material from the viewpoint of preventing physical or chemical changes, such as peeling, abrasion, and oxidation of the functional material. Therefore, in a preferred embodiment of the present invention, the patterned fiber substrate has a protective material on at least a part of at least one surface of the patterned fiber substrate. Further, in a preferred embodiment of the present invention, the patterned fiber substrate laminate has a protective material on at least a part of at least one surface of the patterned fiber substrate laminate.

When the patterned fiber substrate or the patterned fiber substrate laminate has a protective material on the whole of both the surfaces thereof, the bending resistance characteristics can be improved since it is easier to design the patterned fiber substrate or the patterned fiber substrate laminate to be located at the center of stress against bending stress at the time of bending the patterned fiber substrate or the patterned fiber substrate laminate. The patterned fiber substrate or the patterned fiber substrate laminate preferably has the above configuration, especially when using it for applications where bending stress is easy to occur such as applications on a flexible circuit board.

When the pattern is formed from a material having electrical conductivity, such as a conductive material or a semiconductive material, it is preferable from the viewpoint of obtaining stable electrical characteristics to provide a protective material having insulating properties on at least a part of at least the surface on which the pattern is formed (specifically, on the pattern, a part of the surface including the pattern, or the whole of the surface on which the pattern is formed).

Examples of usable materials for the protective material include fiber substrates such as nonwoven fabrics, woven fabrics, and knitted fabrics; various polymer materials such as PET, PEN, and PI; various resins such as epoxy resins, phenol resins, fluororesins, ultraviolet curable resins, and thermosetting resins; varnishes; rubber materials; composite materials comprising a fiber substrate and a polymer material impregnated into the fiber substrate; carbon fiber reinforced plastics; and plant-derived materials such as cellulose nanofibers. Sheets based on these materials can be used as the protective material. An adhesive layer may be present between the patterned fiber substrate or the patterned fiber substrate laminate and the protective material. The type of the adhesive constituting the adhesive layer is not particularly limited as long as the adhesive does not adversely affect the functionality exhibited by the pattern, and examples thereof include epoxy resin-based adhesives, vinyl resin-based adhesives, rubber-based adhesives, silicone resin-based adhesives, starch-based adhesives, and cellulose-based adhesives.

The patterned fiber substrate that may have, if necessary, a protective material on at least a part of at least one surface thereof can be used in, for example, sensing elements, switch elements, display elements such as displays, electrical energy supply elements such as power generation elements, light emitting elements, batteries, and power generation elements, elements provided with a design using pigments or dyes, piezoelectric elements, wiring elements, and combinations thereof.

In the above-mentioned elements, the patterned fiber substrates can be used alone or in combination of two or more thereof.

Examples of the case where the patterned fiber substrate is used alone include a case where the patterned fiber substrate used comprises a first pattern included in a piezoelectric element and a second pattern included in a wiring element Examples of the case also include a case where the fiber substrate comprises at least one conductive pattern, has a protective material on both surfaces of the substrate, and constitutes a flexible printed circuit (FPC). These cases enable the configuration of a lightweight and highly flexible piezoelectric element, actuator or the like taking advantage of the features of the fiber substrate.

Further, examples of the case where the patterned fiber substrates are used in combination of two or more thereof include a case where a first patterned fiber substrate is used in a sensing element or a display element, a second patterned fiber substrate is used in a power generation element or an electrical energy supply element, and the sensing element or display element and the power generation element or electrical energy supply element are used in combination, and a case where a first patterned fiber substrate is used in an element provided with a design, a second patterned fiber substrate comprising a first pattern included in a light emitting element and a second pattern included in a wiring element is used, and the element provided with a design, and the light emitting element and the wiring element are used in combination. In the latter case, an element having excellent design can be obtained.

It is also possible to laminate two or more patterned fiber substrates used in combination to use the resulting laminate as the above-mentioned patterned fiber substrate laminate. Specifically, for example, a first patterned fiber substrate, a second patterned fiber substrate, and a third patterned fiber substrate may be laminated in an arbitrary order to form a patterned fiber substrate laminate. In one embodiment of the present invention, in this case, the at least two conductive patterns included in the separate patterned fiber substrates, for example, the at least one conductive pattern included in the first patterned fiber substrate and the at least one conductive pattern included in the second patterned fiber substrate are electrically connected together by being partially in contact with each other or by another conductive pattern.

[Method for Producing Patterned Fiber Substrate]

The patterned fiber substrate of the present invention can be produced by a method comprising the steps of:

(i) forming a lyophilic region on the fiber substrate and in inside of the fiber substrate;

(ii) providing a solution or a dispersion of the functional material to the formed lyophilic region; and (iii) removing a solvent or a dispersion medium from the provided solution or dispersion.

<Step (i)>

In step (i), a fiber substrate having a lyophilic region on the fiber substrate and in the inside of the fiber substrate is obtained.

As the fiber substrate, the fiber substrate mentioned in the paragraph <Fiber substrate> can be used. The fiber substrate in the present invention can have the sufficient contact angle or liquid repellency by the selection of the form of the fiber substrate, the type or average fiber diameter of the fibers constituting the fiber substrate, or the like. In this case, the fiber substrate does not have to be subjected to the raising or liquid repellent treatment, and thus the productivity can be improved. Therefore, in a preferred embodiment of the present invention, in step (i), the lyophilic region is formed on the fiber substrate that is not subjected to a liquid repellent treatment and in the inside of the fiber substrate that is not subjected to a liquid repellent treatment.

The lyophilic region is preferably formed by placing, on the fiber substrate, a photomask having a thin film (for example, a chromium thin film) serving as a light-shielding film and patterned in a desired pattern on a transparent substrate (for example, soda lime glass or synthetic quartz), and irradiating the fiber substrate with an electromagnetic wave, plasma, or ozone (hereinafter also referred to as an "electromagnetic wave or the like") from above the photomask. The irradiation of the fiber substrate having liquid repellency with the electromagnetic wave or the like causes photodecomposition only in the irradiated area due to an oxidizing action, making the irradiated area lyophilic. In this way, the irradiated part is made lyophilic, and the liquid repellency of the fiber substrate is maintained in the non-irradiated part (the area shielded from the electromagnetic wave or the like by the light-shielding film). Therefore, the lyophilic region and a liquid repellent region can be present on one fiber substrate and in the inside of one fiber substrate.

Figure 7:
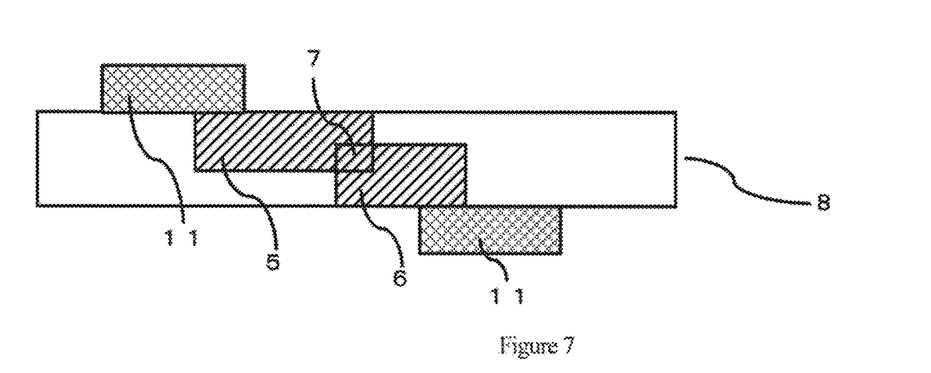
FIG. 7 is a schematic cross-sectional view of a part of a configuration that is one embodiment of the patterned fiber substrate of the present invention.

In the case of producing the patterned fiber substrate in which electrical conduction between front and back surfaces is ensured, the above-mentioned irradiation may be performed on both surfaces of the fiber substrate. Alternatively, when the fiber substrate has a small thickness (for example, when the thickness is 50 μm or less), the irradiation may be performed on one surface of the fiber substrate. When the irradiation is performed on both surfaces of the fiber substrate, irradiation for forming the conductive pattern (A) [irradiation (A)], irradiation for forming the conductive pattern (B) [irradiation (B)], and irradiation for forming a conductive pattern that electrically connects the two conductive patterns together [irradiation (C)] can be performed in any order. Here, when the irradiation (A) and the irradiation (B) form a conductive pattern that electrically connects the conductive pattern (A) and the conductive pattern (B) together (for example, in the case of FIG. 7), the irradiation (C) does not have to be performed.

The irradiation (A), the irradiation (B), and the irradiation (C) may be performed separately. However, depending on the desired depth of the lyophilic region, the irradiation (A) and the irradiation (C), or the irradiation (B) and the irradiation (C) can be performed at the same time for at least a part of the time. In the latter case, the productivity can be improved.

The photomask can be produced by a publicly-known method. For example, a photomask patterned as desired can be produced by drawing a desired pattern on a blank (generally consisting of a transparent substrate on which a chromium thin film serving as a light-shielding film is formed and a resist is applied), which is a material of a photomask, removing the resist by development, removing, by etching, a part of the chromium thin film from which the resist has been removed, peeling off the resist that is no longer needed, and then washing the blank. A fine pattern can be formed on the photomask as desired. Moreover, the degree of freedom in the pattern design is not limited. Using such a photomask, a fine lyophilic region as desired can be formed without restrictions on the pattern design.

In the present invention, when the electromagnetic wave or the like with which the fiber substrate is irradiated is an electromagnetic wave, the electromagnetic wave may be ultraviolet light having a wavelength of 1 to 400 nm. Therefore, in a preferred embodiment of the present invention, in step (i), the lyophilic region is formed by irradiating the outside of the fiber substrate and the inside of the fiber substrate with ultraviolet light.

Examples of the ultraviolet light include extreme ultraviolet light (1 to 10 nm), vacuum ultraviolet light (wavelength 10 to 220 nm), middle ultraviolet light (wavelength 220 to 320 nm), and near ultraviolet light (wavelength 320 to 400 nm). When the fiber substrate is irradiated with vacuum ultraviolet light, a commercially available xenon excimer lamp capable of emitting vacuum ultraviolet light having a wavelength of 172 nm can be used as a light source. When the fiber substrate is irradiated with middle ultraviolet light or near ultraviolet light, a mercury xenon lamp, a mercury lamp, a xenon lamp, or a xenon excimer lamp can be used as a light source. Further, a KrF excimer laser capable of emitting ultraviolet light having a wavelength of 248 nm, an ArF excimer laser capable of emitting ultraviolet light having a wavelength of 193 nm, or a $F_2$ excimer laser capable of emitting ultraviolet light having a wavelength of 157 nm may be used.

The integral quantity of the ultraviolet light can be appropriately determined according to the contact angle with pure water on the surface of the fiber substrate in the lyophilic region to be formed, or the depth of the lyophilic region to be formed in the inside of the fiber substrate. The integral light quantity may be usually 0.01 to 12 $J/cm^2$, and particularly 0.5 to 5 $J/cm^2$.

The fiber substrate may be heat-treated at about 50 to 150° C. before or after irradiation with the electromagnetic wave or the like. When the fiber substrate is inhibited from becoming lyophilic by oxygen, the fiber substrate may be irradiated with the electromagnetic wave or the like in an atmosphere of an inert gas such as nitrogen or argon.

<Step (ii)>

In step (ii), a fiber substrate with a solution or a dispersion of a functional material applied to the lyophilic region formed in step (i) is obtained. This step may be performed immediately after the completion of step (i), or after a certain period of time has passed from the completion of step (i) (usually within several hours, for example, within 1 hour).

In this step, a wide range of functional material solutions or dispersions as described above can be used. The functional material solution or dispersion can be prepared by mixing the functional material and a solvent or a dispersion medium with a publicly-known mixer (for example, a ball mill, a bead mill, a sand mill, a roll mill, a homogenizer, an attritor, a dissolver, or a paint shaker). The solvent or dispersion medium may be any solvent or dispersion medium that can provide a stable solution or dispersion of the functional material and can be removed in step (iii). For example, the solvent or dispersion medium may be any of water, a mixture of water and a water-miscible organic solvent or organic dispersion medium, or a water-free organic solvent or organic dispersion medium.

Examples of the water-miscible organic solvent or organic dispersion medium include alcohols such as methyl alcohol, ethyl alcohol, n-propyl alcohol, isopropyl alcohol, n-butyl alcohol, isobutyl alcohol, and tert-butyl alcohol; ketones such as acetone and 2-butanone; polyhydric alcohols such as ethylene glycol and glycerin, and esters thereof; and glycol ethers such as ethylene glycol monoethyl ether, ethylene glycol dimethyl ether, diethylene glycol monobutyl ether, diethylene glycol dimethyl ether, propylene glycol methyl ether acetate, and butyl diethylene glycol acetate. These organic solvents or organic dispersion media can be used alone or in combination of two or more thereof. The mass ratio of the water-miscible organic solvent or organic dispersion medium to water may be 99:1 to 1:99, and is preferably 2:1 to 1:6.

Examples of the water-free organic solvent or organic dispersion medium include those mentioned above as water-miscible organic solvents or organic dispersion media. These organic solvents or organic dispersion media may be used alone or in combination of two or more thereof without being mixed with water.

Further, an organic solvent or organic dispersion medium immiscible with water can also be used. Examples thereof include long-chain alkanes such as hexane, heptane, octane, nonane, decane, undecane, dodecane, tridecane, tetradecane, pentadecane, hexadecane, octadecane, nonadecane, eicosane, and trimethylpentane; cyclic alkanes such as cyclohexane, cyclobutane, and cyclooctane; aromatic hydrocarbons such as benzene, toluene, xylene, trimethylbenzene, and dodecylbenzene; and alcohols such as hexanol, heptanol, octanol, decanol, cyclohexanol, and terpineol. These organic solvents or organic dispersion media can be used alone or in combination of two or more thereof.

The solvent or dispersion medium is preferably water in view of ease of removal of the solvent or dispersion medium in step (iii) and for environmental reasons.

The concentration of the functional material in the solution or dispersion can be appropriately determined according to the functional material, and may be, for example, 0.01 to 50 mass %.

The solution or dispersion of the functional material may contain, if necessary, common additives (for example, dispersants such as surfactants and various polymer materials).

When the functional material is a conductive material, a commercially available conductive ink or conductive polymer solution can also be used. Examples of the commercially available products include DryCure Ag-J 0410B manufactured by C-INK Co., Ltd. and an aqueous PEDOT:PSS solution Orgacon S315 manufactured by Merck KGaA.

The solution or dispersion of the functional material can be provided to the lyophilic region by, for example, an inkjet method, a screen printing method, an offset printing method, letterpress printing, intaglio printing, a dip nip method, a dipping method based on a capillary phenomenon, a liquid pressure transfer method, a water pressure transfer method, a bar coating method, or a slit coating method.

The fiber substrate in the present invention is inherently liquid repellent by itself. Therefore, even when a solution or a dispersion of the functional material is provided to the whole surface of the fiber substrate by, for example, a liquid pressure transfer method, it is possible to provide the solution or dispersion of the functional material only to the lyophilic region. Further, for example, even when a part of the lyophilic region is brought into contact with a solution or a dispersion of the functional material in, for example, the dipping method based on a capillary phenomenon, it is also possible to provide the solution or dispersion of the functional material only to the lyophilic region owing to the capillary phenomenon. Of course, when a solution or a dispersion of the functional material is provided only to the lyophilic region on the surface of the fiber substrate by an inkjet method, a screen printing method or the like, it is also possible to provide the solution or dispersion of the functional material only to the lyophilic region.

In the case of producing the patterned fiber substrate in which electrical conduction between front and back surfaces is ensured, the above-mentioned solution or dispersion of the functional material may be provided to both surfaces or one surface of the fiber substrate. When the above-mentioned solution or dispersion of the functional material is provided to both surfaces, the method for providing the solution or dispersion to both the surfaces may be the same or different.

When the above-mentioned solution or dispersion of the functional material is provided to one surface, a reduced pressure may be applied to the surface opposite to the surface of the fiber substrate to which the solution or dispersion of the functional material is provided in order to promote the provision of the solution or dispersion of the functional material to the lyophilic region.

The solution or dispersion of the functional material provided to the lyophilic region hardly spreads or does not spread at all to a region other than the lyophilic region (that is, a liquid repellent region). Moreover, this phenomenon is exhibited regardless of the type of the functional material, the viscosity or concentration of the solution or dispersion of the functional material, and the like. Specifically, it is possible to provide a wide variety of functional material solutions or dispersions easily and accurately to a fine lyophilic region formed without restrictions on the pattern design. Further, since the lyophilic region is formed not only at the outside of the fiber substrate but also in the inside of the fiber substrate, the solution or dispersion of the functional material can easily and accurately penetrate into the desired depth of the fiber substrate.

As described above, even when the above-mentioned solution or dispersion of the functional material is provided only to one surface in the production of a patterned fiber substrate in which electrical conduction between front and back surfaces is ensured, it is surprisingly possible to provide the solution or dispersion of the functional material only to the lyophilic region. This can bring about a significant improvement in productivity. In addition, it is possible to easily and accurately ensure electrical conduction between front and back surfaces without forming a hole such as a via hole. Further, since this configuration does not require the area corresponding to the hole portion of the via hole, it is possible to reduce the space required for the electrical connection portion and provide a more efficient circuit design.

<Step (iii)>

In step (iii), a solvent or a dispersion medium is removed from the solution or dispersion contained in the fiber substrate produced in step (ii), whereby a patterned fiber substrate is obtained. This step may be performed immediately after the completion of step (ii), or after a certain period of time has passed from the completion of step (ii) (usually within several hours, for example, within 1 hour).

The solvent or dispersion medium can be removed by evaporation, for example, by heating (for example, to 50 to 200° C.) the fiber substrate to which the solution or dispersion of the functional material has been provided in step (ii). The solvent or dispersion medium may be removed under reduced pressure (for example, $1\times10^{-4}$ to $1\times10^4$ Pa).

The solvent or dispersion medium is simply removed from the solution or dispersion of the functional material accurately provided only to the lyophilic region of the fiber substrate in step (ii), whereby a fine pattern is formed on the fiber substrate. As described above, in the method of the present invention, it is possible to produce a patterned fiber substrate also having a fine pattern by a simpler method using a wide range of functional material solutions or dispersions.

Further, in the patterned fiber substrate obtained by removal of the solvent or dispersion medium, at least a part of the functional material constituting the pattern is present in the inside of the fiber substrate. Since the functional material present in the inside of the fiber substrate acts as a so-called anchor, the patterned fiber substrate can have excellent bending resistance.

When the functional material is metal nanoparticles or metal nanowires, the functional material can be heated, for example, at 60 to 250° C. (preferably at 80 to 160° C.) for 5 to 1200 minutes (preferably for 20 to 180 minutes) to remove the dispersion medium, and at the same time, fuse the metal nanoparticles or the metal nanowires to each other. As a result, a metal thin film is formed at least partially on the surface of the fiber substrate on which the dispersion medium has been held, and further, the fused metal adheres to at least a part of the fibers constituting the fiber substrate or spreads to at least a part of voids between the fibers in the inside of the fiber substrate in which the dispersion medium has been held. Such integration of the fiber substrate and the fused metal can further improve the excellent bending resistance of the patterned fiber substrate.

<Laminating Step>

When producing the patterned fiber substrate laminate comprising a plurality of patterned fiber substrates, the production method comprises the step of laminating at least two patterned fiber substrates that are selected from the group consisting of a patterned fiber substrate obtained in step (iii), and a patterned fiber substrate having a protective material on at least a part of at least one surface thereof, which is obtained in step (iv) described later.

As a method for laminating the patterned fiber substrates, a generally known bonding method can be used. For example, the patterned fiber substrates can be bonded together by a laminator optionally with heating using an adhesive, or by heating according to a roll-to-roll method or a batch method. In general, it is preferable to adopt the roll-to-roll method in the case of a long patterned fiber substrate, and to adopt the batch method in the case of a relatively small patterned fiber substrate such as a patterned fiber substrate of A4 size or smaller. When an adhesive is used, adhesives mentioned in the paragraph <Protective material> can be used.

At the time of bonding, a reduced pressure (for example, $1\times10^{-3}$ to $5\times10^4$ Pa) may be applied. However, according to the present invention, bubbles are easily released from the patterned fiber substrate without the application of the reduced pressure, so that intrusion of bubbles, which may cause a significant problem in bonding the substrates to each other, is less likely to occur, and as a result, it is easy to obtain a patterned fiber substrate laminate having an advantage of excellent uniformity. When patterned fiber substrates each having a protective material on at least a part of at least one surface thereof are laminated, it may be preferable to apply a reduced pressure depending on the number, area or the like of the protective materials.

When alignment of the patterns of different patterned fiber substrates is required in laminating a plurality of patterned fiber substrates, the positions of the patterns may be measured with a pattern identification device such as an optical camera to align the positions. The procedure for the alignment is not particularly limited. For example, first, a step of temporarily fixing the position of the first patterned fiber substrate is performed by vacuum adsorption or using an adhesive or the like, then a step of measuring and memorizing the position of the pattern is performed with an optical camera or the like, and then a step of aligning the second patterned fiber substrate with the position of the first patterned fiber substrate is performed. After the alignment, the bonding is performed so as not to cause misalignment optionally with heating using an adhesive, or by heating. When a curable adhesive is used, the adhesive is cured by the application of heat or light energy and pressure, if necessary. Finally, the temporary fixing of the patterned fiber substrates is released to give a patterned fiber substrate laminate.

When the above-mentioned electronic component is electrically connected to the conductive pattern in the patterned fiber substrate, the connection method is not particularly limited. A method generally used in the art can be used.

<Method for Producing Patterned Fiber Substrate or Patterned Fiber Substrate Laminate, which has Protective Material>

When the patterned fiber substrate has a protective material, the production method comprises the step of:

(iv) forming a protective material on at least a part of at least one surface of the patterned fiber substrate obtained in step (iii).

When the patterned fiber substrate laminate has a protective material on a surface thereof, the production method comprises the step of:

forming a protective material on at least a part of at least one surface of the patterned fiber substrate laminate.

When a sheet-shaped protective material is used, the protective material can be formed by bonding the sheet-shaped protective material to at least a part of at least one surface of the patterned fiber substrate or the patterned fiber substrate laminate according to a general method using, for example, a laminator or a sheet bonding device. The sheet-shaped protective material can also be bonded with an adhesive. As the adhesive in such a case, adhesives mentioned in the paragraph <Protective material> can be used.

The protective material can also be formed by application of a solution or a dispersion and the subsequent removal of a solvent or a dispersion medium. Specifically, the protective material can be formed by applying (for example, by coating, printing, transfer, spraying, or casting) the solution or dispersion of the protective material to the patterned fiber substrate or the patterned fiber substrate laminate, or bringing the patterned fiber substrate or the patterned fiber substrate laminate into contact with or dipping the patterned fiber substrate or the patterned fiber substrate laminate in the solution or dispersion of the protective material, and then removing the solvent or the dispersion medium (for example, by drying). For example, when forming a protective material consisting of a polyimide, a polyimide solution or a polyimide precursor solution can be used as the solution or dispersion of the protective material.

When the pattern of the patterned fiber substrate or the patterned fiber substrate laminate is a conductive pattern, the protective material can be formed only on the pattern portion by an electrodeposition method.

Therefore, in one embodiment of the present invention, in step (iv), the protective material is formed by bonding of the protective material in sheet shape to the patterned fiber substrate, applying or electrodepositing a solution or a dispersion of the protective material to the patterned fiber substrate, and subsequently removing a solvent or a dispersion medium, or dipping the patterned fiber substrate into a solution or a dispersion of the protective material, and subsequently removing a solvent or a dispersion medium.

These procedures can also be used in the step of forming the protective material on at least a part of at least one surface of the patterned fiber substrate laminate.

When a plurality of protective materials are present on one surface of the patterned fiber substrate or the patterned fiber substrate laminate, or when a protective material is present on both surfaces of the patterned fiber substrate or the patterned fiber substrate laminate, the steps of forming the protective materials may be the same or different, and can be performed simultaneously or sequentially.

EXAMPLES

Hereinafter, the present invention is described in detail with reference to the examples and the comparative examples, but the present invention is not limited to these examples. In the following examples and comparative examples, physical property values were measured by the following methods.

[Average Fiber Diameter of Fibers Constituting Fiber Substrate]

The average fiber diameter of the fibers constituting each fiber substrate was determined in accordance with JIS L 1015 "Test methods for man-made staple fibres (8.5.1)".

[Contact Angle]

A fine pure water droplet (size of pure water droplet: 0.7 µL) was dropped on the surface of each fiber substrate, and the shape of the pure water droplet viewed in the direction perpendicular to the fiber substrate was photographed with a camera By the general θ/2 method that is a common method as a method for measuring a contact angle, a contact angle (static contact angle) 1 second after the fiber substrate and the pure water droplet came into contact with each other was calculated. The wettability evaluation apparatus LSE-ME3 (trade name) manufactured by NiCK Corporation was used as a contact angle measuring device. The average of three measurements was used as the contact angle of the surface of the fiber substrate with pure water.

[Air Permeability]

The air permeability of each fiber substrate was measured in accordance with the Frazier method of JIS L 1913:2010 "Test methods for nonwovens, air permeability".

[Line Width and Spacing Between Wires of Conductive Pattern]

The line width and the spacing between the wires of each conductive pattern were obtained from the stereomicroscope image of the conductive pattern. The averages (n=3 for each conductive pattern) were obtained, and regarded as the line width and the spacing between the wires of the conductive pattern.

[Depth of Functional Material Reaching Inside of Substrate from Surface of Substrate]

The cross section of each patterned substrate including the conductive pattern formed with the conductive ink was observed under the scanning electron microscope, and the distance of the penetrated conductive ink from the surface of the substrate was read. The average (n=3 for each patterned substrate) was obtained, and regarded as the depth of the functional material from the surface of the substrate.

When the substrate was a fiber substrate, the cut surface for observation of the patterned substrate was formed by first filling the inside of the fiber substrate with a thermosetting epoxy resin, performing vacuum defoaming, curing the thermosetting epoxy resin by heating it on a hot plate at 80° C. under atmospheric pressure in the air atmosphere for 90 minutes, and then subjecting the fiber substrate to an ion milling method using an ion beam (Ar) so that the positions of the silver and the fibers constituting the fiber substrate did not shift during cutting. When the substrate was a film, the cut surface of the patterned substrate was formed by an ion milling method using an ion beam (Ar) without filling the substrate with a thermosetting epoxy resin.

Example 1

As a fiber substrate, the polybutylene terephthalate (PBT) nonwoven fabric having a basis weight of 25 g/m$^2$, an air permeability of 45 cm$^3$/cm$^2$·s, and a thickness of 250 µm was used. The fibers constituting the PBT nonwoven fabric had an average fiber diameter of 5 µm. The PBT nonwoven fabric had a contact angle of 129° with pure water on its surface in an initial state (before irradiation with vacuum ultraviolet light). The fact that the contact angle is significantly larger than the inherent contact angle of PBT (about 90°) means that the surface of the PBT nonwoven fabric has high liquid repellency due to its structure (double roughness structure) and the like.

Then, the integral quantity of vacuum ultraviolet light sufficient for forming a desired lyophilic region on the fiber substrate and in the inside of the fiber substrate was determined. Specifically, the integral light quantity was determined by irradiating one surface of the PBT nonwoven fabric with vacuum ultraviolet light (wavelength; 172 nm) from above while circulating nitrogen at a flow rate of 19 L/min, and then measuring the contact angle of the surface of the nonwoven fabric. The nonwoven fabric was irradiated with vacuum ultraviolet light using the excimer irradiation system MEIRA-MS-1-152-H3 (trade name) manufactured by M. D. COM. inc. The integral light quantity for adjusting the contact angle of the surface of the fiber substrate with pure water to 5° or less was 1.63 J/cm$^2$.

Then, the conductive pattern was formed. Specifically, the photomask having the chromium thin film patterned in the desired pattern on quartz glass was prepared, the photomask was placed on the nonwoven fabric substrate in the initial state, and the nonwoven fabric substrate was irradiated with vacuum ultraviolet light from above at an integral light quantity of 1.63 J/cm$^2$. As a result, the lyophilic region (part irradiated with vacuum ultraviolet light) and the liquid repellent region (non-irradiated part) were present on one fiber substrate and in the inside of one fiber substrate. The conductive ink was applied to the whole surface of the irradiated side of the fiber substrate by a liquid pressure transfer method, whereby the conductive ink penetrated into the fiber substrate and was held only in the lyophilic region. As the conductive ink, the silver ink (DryCure Ag-J 0410B: trade name) manufactured by C-INK Co., Ltd., which is a silver nanoparticle conductive ink containing an aqueous solvent, was used. Then, for drying the conductive ink and sintering the silver nanoparticles, the fiber substrate was heated at 150° C. for 30 minutes using the hot plate to give a patterned fiber substrate.

Figure 1:
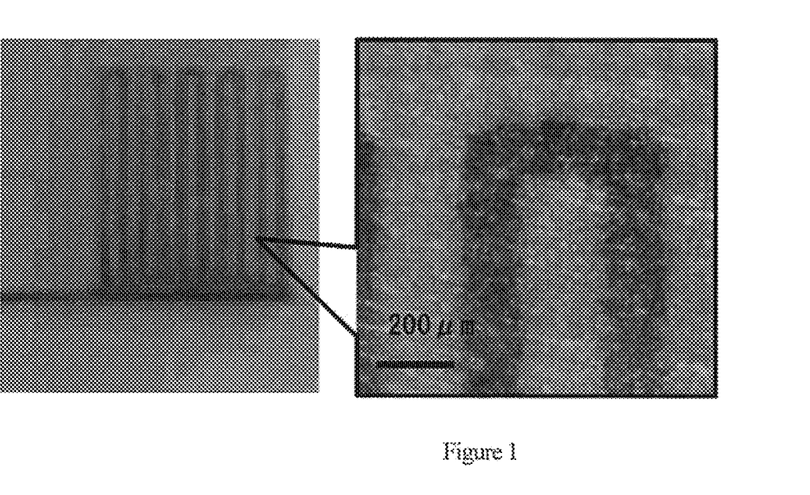
FIG. 1 is a stereomicroscope image of a part of the conductive pattern of the patterned fiber substrate produced in Example 1.
Figure 2:
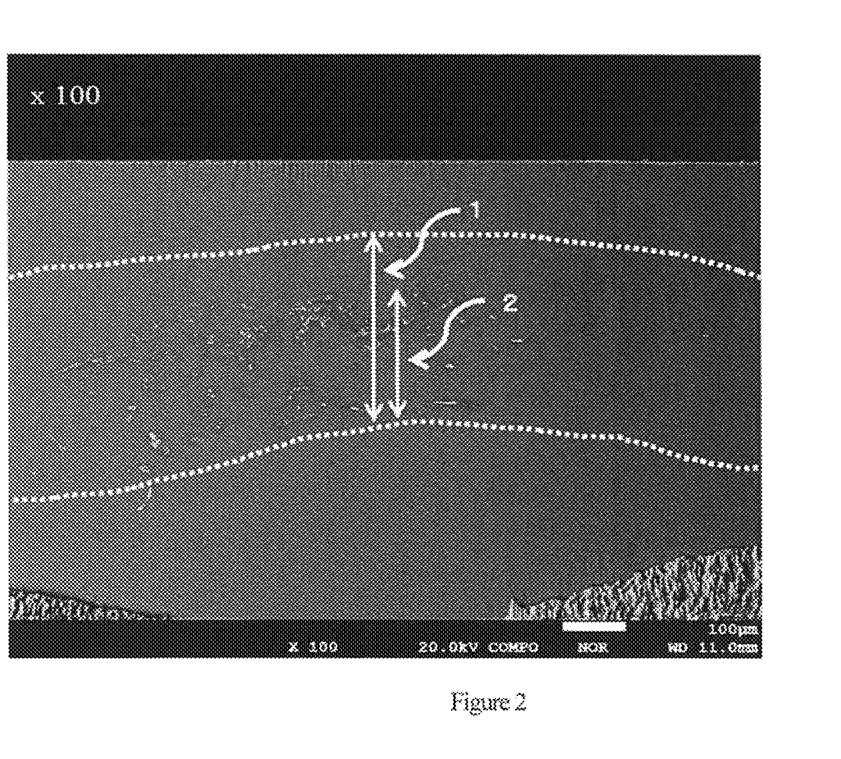
FIG. 2 is a scanning electron microscope image of a cross section of the test piece for bending resistance test, the test piece corresponding to the patterned fiber substrate of Example 1.

FIG. 1 shows a part of the formed conductive pattern. In the conductive pattern, the wiring had no bleeding, the narrowest line width was 200 µm, the spacing between wires was 200 µm, and at least a part of the silver constituting the conductive pattern was present in the inside of the fiber substrate. Moreover, the cross-sectional observation showed that at least a part of the silver constituting the conductive pattern reached a depth of 200 µm from the surface of the fiber substrate (FIG. 2). Therefore, the obtained patterned fiber substrate was excellent in bending resistance.

Example 2

As a fiber substrate, the liquid crystal polymer (LCP) nonwoven fabric [VECRUS (registered trademark) manufactured by Kuraray Kuraflex Co., Ltd.] having a basis weight of 25 g/m$^2$, an air permeability of 80 cm$^3$/cm$^2$·s, and a thickness of 70 µm was used. The fibers constituting the LCP nonwoven fabric had an average fiber diameter of 7 µm. The LCP nonwoven fabric had a contact angle of 105° with pure water on its surface in an initial state. The fact that the contact angle is larger than the inherent contact angle of the LCP (about 70°) means that the surface of the LCP nonwoven fabric has liquid repellency due to its structure (double roughness structure) and the like.

Then, a lyophilic region was formed on the fiber substrate and in the inside of the fiber substrate by irradiation with vacuum ultraviolet light in the same manner as in Example 1 except that the LCP nonwoven fabric was used instead of the PBT nonwoven fabric. Since the contact angle of the surface of the LCP nonwoven fabric with pure water is decreased to about 40° or less by irradiation with vacuum ultraviolet light, the contact angle falls below the contact angle range that can be expressed by the Cassie-Baxter equation. This means that the surface of the LCP nonwoven fabric no longer exhibited liquid repellency. The conductive ink same as that in Example 1 was applied to the fiber substrate by an inkjet method to hold the conductive ink only in the lyophilic region. Then, the fiber substrate was heated for drying the conductive ink and sintering the silver nanoparticles in the same manner as in Example 1 to give a patterned fiber substrate.

In the formed conductive pattern, the narrowest line width was 400 µm, and the spacing between wires was 400 µm. Further, at least a part of the silver constituting the conductive pattern was present in the inside of the fiber substrate. Therefore, the obtained patterned fiber substrate was excellent in bending resistance.

Example 3

As a fiber substrate, the LCP nonwoven fabric [VECRUS (registered trademark) manufactured by Kuraray Kuraflex Co., Ltd.] having a basis weight of 25 g/m$^2$, an air permeability of 10 cm$^3$/cm$^2$·s, and a thickness of 50 µm was used. The fibers constituting the LCP nonwoven fabric had an average fiber diameter of 3 µm. The LCP nonwoven fabric had a contact angle of 111° with pure water on its surface in an initial state. The fact that the contact angle is larger than the inherent contact angle of the LCP (about 70°) means that the surface of the LCP nonwoven fabric has high liquid repellency due to its structure (double roughness structure), the small average fiber diameter of the fibers constituting the LCP nonwoven fabric, and the like.

Then, a lyophilic region was formed on the fiber substrate and in the inside of the fiber substrate by irradiation with vacuum ultraviolet light in the same manner as in Example 1 except that the LCP nonwoven fabric was used instead of the PBT nonwoven fabric. The conductive ink same as that in. Example 1 was applied to the fiber substrate by a dipping method based on a capillary phenomenon to hold the conductive ink only in the lyophilic region. Then, the fiber substrate was heated for drying the conductive ink and sintering the silver nanoparticles in the same manner as in Example 1 to give a patterned fiber substrate.

It was possible to produce the patterned fiber substrate hi which, in the conductive pattern, the wiring had no bleeding, the narrowest line width was 200 µm, and the spacing between wires was 400 µm. Further, at least a part of the silver constituting the conductive pattern was present in the inside of the fiber substrate. Therefore, the obtained patterned fiber substrate was excellent in bending resistance.

Example 4

The patterned fiber substrate was obtained in the same manner as in Example 1 except that the colloidal solution of electroless plating catalyst was used instead of the conductive ink, and that the fiber substrate was heated at 100° C. for 10 minutes for drying the colloidal solution of electroless plating catalyst instead of being heated at 150° C. for 30 minutes for drying and sintering the conductive ink. As the colloidal solution of electroless plating catalyst, the electroless plating catalyst solution (OPC-80 CATALYST: trade name) manufactured by Okuno Chemical Industries Co., Ltd., which is a palladium/tin colloidal solution containing an aqueous solvent, was used. Then, the electroless plating solution was applied to the patterned fiber substrate by a dipping method so that only the region holding the electroless plating catalyst was plated. As the electroless plating solution, the mixed liquid of electroless copper plating solutions (ATS ADDCOPPER IW-A: trade name, ATS ADDCOPPER C: trade name, ATS ADDCOPPER IW-M: trade name, and electroless copper R-N: trade name) manufactured by Okuno Chemical Industries Co., Ltd., which are copper plating solutions containing an aqueous solvent, was used. Then, for drying the electroless plating solution, the fiber substrate was heated at 100° C. for 10 minutes using an oven to give a fiber substrate with the plating pattern.

It was possible to produce the fiber substrate with the plating pattern in which, in the plating pattern, the wiring had no bleeding, the narrowest line width was 200 µm, and the spacing between wires was 200 µm. In addition, at least a part of the copper constituting the plating pattern was present in the inside of the fiber substrate. Therefore, the obtained patterned fiber substrate was excellent in bending resistance. Further, the wiring of the plating pattern had a sheet resistance value of 0.1Ω/□, and was excellent in conductivity.

Example 5

Figure 6:
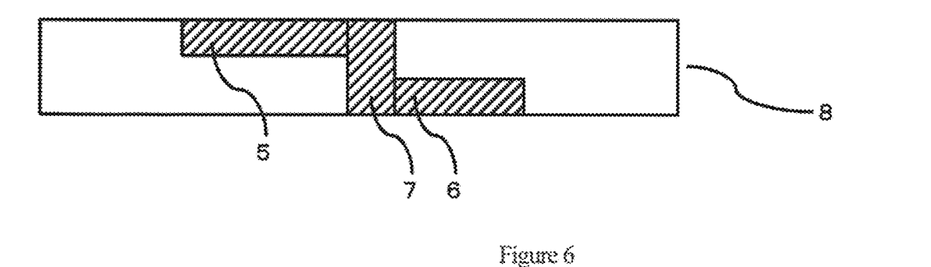
FIG. 6 is a schematic cross-sectional view of a part of the configuration of the patterned fiber substrate of Example 5.

The patterned fiber substrate including the conductive pattern (A) formed on one surface and the conductive pattern (B) formed on the other surface was produced in the same manner as in Example 1 except that not only one surface but also both surfaces of the fiber substrate were irradiated with vacuum ultraviolet light, and that an inkjet method was adopted instead of the liquid pressure transfer method. In this case, the fiber substrate was irradiated with vacuum ultraviolet light so that a part of the conductive pattern (A) and a part of the conductive pattern (B) were connected together by another conductive pattern as shown in FIG. 6.

In the conductive pattern, the wiring had no bleeding, the narrowest line width was 200 µm, and the spacing between wires was 200 µm. Further, at least a part of the silver constituting the conductive pattern was present in the inside of the fiber substrate. Therefore, the obtained patterned fiber substrate was excellent in bending resistance.

The measurement of the sheet resistance in the conductive pattern portion showed that the surface to which the conductive ink was applied by the inkjet method [specifically, the surface on which the conductive pattern (A) was formed, the front surface] had a resistance of 0.1Ω/□, and that the opposite surface [specifically, the surface on which the conductive pattern (B) was formed, the back surface] had a resistance of 0.1Ω/□. In addition, the measurement of the resistance value of the other conductive pattern portion electrically connecting the conductive pattern (A) and the conductive pattern (B) together in the direction perpendicular to the front surface and the back surface of the patterned fiber substrate showed that the resistance value was less than 0.01Ω. This showed that the electrical conduction between the front and back surfaces of the patterned fiber substrate was established.

Example 6

As a fiber substrate, the liquid crystal polymer (LCP) nonwoven fabric [VECRUS (registered trademark) manufactured by Kuraray Kuraflex Co., Ltd.] having a basis weight of 25 g/m$^2$, an air permeability of 80 cm$^3$/cm$^2$·s, and a thickness of 70 µm was used. The fibers constituting the LCP nonwoven fabric had an average fiber diameter of 1 µm. The LCP nonwoven fabric had a contact angle of 105° with pure water on its surface in an initial state. The fact that the contact angle is larger than the inherent contact angle of the LCP (about 70°) means that the surface of the LCP nonwoven fabric has liquid repellency due to its structure (double roughness structure) and the like.

Then, a lyophilic region was formed on the fiber substrate and in the inside of the fiber substrate by irradiation with vacuum ultraviolet light in the same manner as in Example 1 except that the LCP nonwoven fabric was used instead of the PBT nonwoven fabric, that the light source unit for printable patterning VUV-Aligner (trade name) manufactured by Ushio Inc. was used in irradiation with vacuum ultraviolet light, and that an inkjet method was adopted instead of the liquid pressure transfer method. Since the contact angle of the surface of the LCP nonwoven fabric with pure water is decreased to about 40° or less by irradiation with vacuum ultraviolet light, the contact angle falls below the contact angle range that can be expressed by the Cassie-Baxter equation. This means that the surface of the LCP nonwoven fabric no longer exhibited liquid repellency. The conductive ink same as that in Example 1 was applied to the fiber substrate by the inkjet method to hold the conductive ink only in the lyophilic region. Then, the fiber substrate was heated for drying the conductive ink and sintering the silver nanoparticles in the same manner as in Example 1 to give a patterned fiber substrate.

In the formed conductive pattern, the narrowest line width was 10 µm, and the spacing between wires was 10 µm. Further, at least a part of the silver constituting the conductive pattern was present in the inside of the fiber substrate. Therefore, the obtained patterned fiber substrate was excellent in bending resistance.

Comparative Example 1

As a fiber substrate, the polyester plain woven fabric having a basis weight of 55 g/m$^2$, an air permeability of 173 cm$^3$/cm$^2$·s, and a thickness of 110 µm was used. The polyester plain woven fabric was a woven fabric made of a polyethylene terephthalate fiber (56 dtex/36 f) and having weaving densities of 150 warp yarns/inch and 90 weft yarns/inch. In addition, an attempt was made to measure the contact angle of the surface of the polyester plain woven fabric with pure water, but the contact angle could not be measured because water droplets penetrated into the inside of the woven fabric within a time of less than 1 second.

An attempt was made to apply the same conductive ink as in Example 1 to the fiber substrate by an inkjet method to provide a conductive pattern, but the conductive ink spread in multiple directions and bled due to the high hydrophilicity of the fiber substrate, and as a result, it was impossible to produce a patterned fiber substrate having a fine pattern.

Comparative Example 2

A lyophilic region was formed by irradiation with vacuum ultraviolet light in the same manner as in Example 1 except that as a substrate, the Teijin (registered trademark) Tetoron (registered trademark) film [a polyethylene terephthalate (PET) film, the contact angle of the surface of the PET film in an initial state with pure water: 79°] having a thickness of 50 µm was used instead of the PBT nonwoven fabric. The conductive ink was applied to the substrate, and the fiber substrate was heated for drying the conductive ink and sintering the silver nanoparticles in the same manner as in Example 1 to give a patterned substrate.

Figure 3:
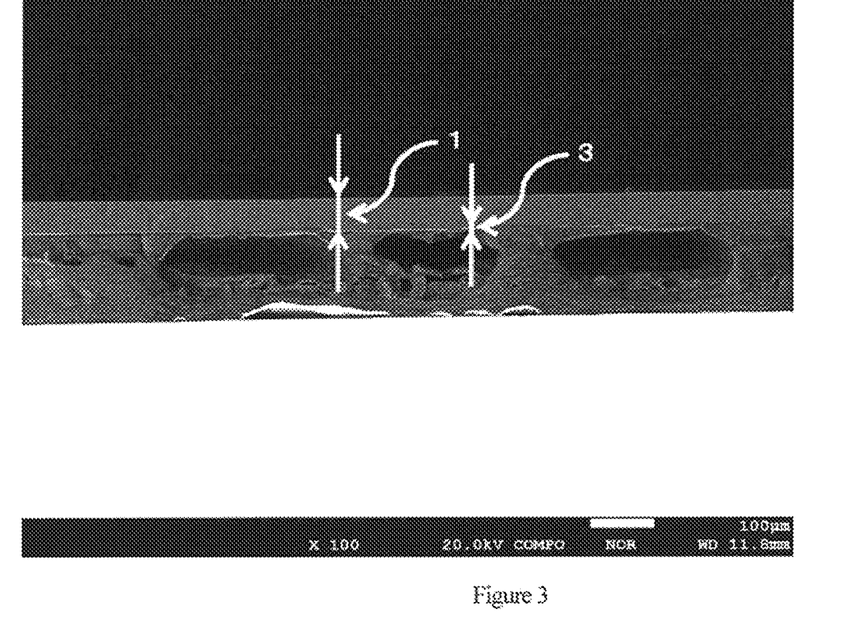
FIG. 3 is a scanning electron microscope image of a cross section of the test piece for bending resistance test, the test piece corresponding to the patterned substrate of Comparative Example 2.
Figure 4:
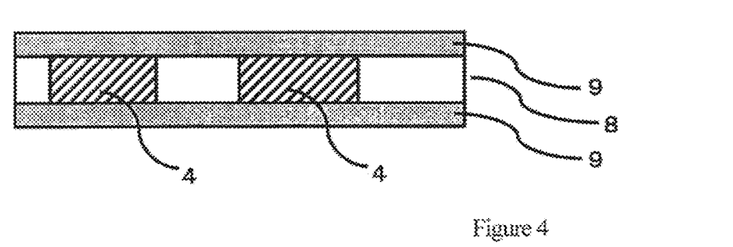
FIG. 4 is a schematic cross-sectional view of a part of a configuration that is one embodiment of the patterned fiber substrate of the present invention.
Figure 5:
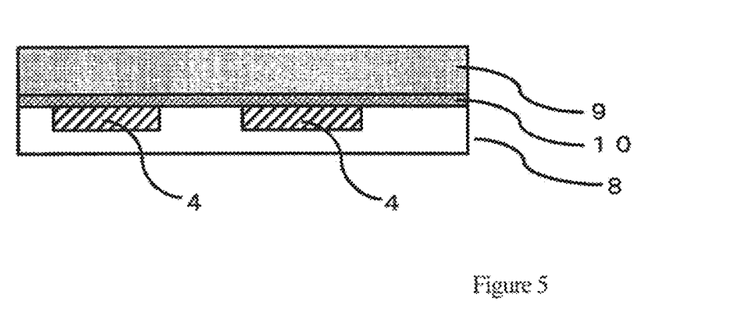
FIG. 5 is a schematic cross-sectional view of a part of a configuration that is one embodiment of the patterned fiber substrate of the present invention.

In the formed conductive pattern, the narrowest line width was 200 μm, and the spacing between wires was 400 μm. However, the cross-sectional observation showed that all the silver constituting the conductive pattern was present on the film and not in the inside of the substrate (FIG. 3), Therefore, the obtained patterned substrate was poor in bending resistance.

Comparative Example 3

The polybutylene terephthalate (PBT) nonwoven fabric having a basis weight of 25 g/m², an air permeability of 45 cm³/cm²·s, and a thickness of 250 μm and used in Example 1 was subjected to a lyophilic treatment Specifically, one surface of the PBT nonwoven fabric was irradiated with vacuum ultraviolet light (wavelength: 172 nm) from above while nitrogen was circulated at a flow rate of 19 L/min. This treatment resulted in the fiber substrate having a contact angle of 90° with pure water on its surface. The irradiation of vacuum ultraviolet light was performed by using the excimer irradiation system METRA-MS-1-152-H3 (trade name) manufactured by M. D. COM. inc.

An attempt was made to apply the same conductive ink as in Example 1 to the obtained fiber substrate by an inkjet method to provide a conductive pattern, but the conductive ink spread in multiple directions and bled due to the high hydrophilicity of the fiber substrate, and as a result, it was impossible to produce a patterned fiber substrate having a fine pattern.

same manner as in Example 1 to give a fiber substrate having a pattern with a size of 1 cm×9 cm. The patterned portion (1 cm×9 cm) was cut out from the fiber substrate to produce a test piece.

Then, a test piece corresponding to the patterned substrate of Comparative Example 2 was produced. Specifically, the Teijin (registered trademark) Tetoron (registered trademark) film [a polyethylene terephthalate (PET) film] having a thickness of 50 μm was used as a substrate. A lyophilic region was formed by irradiation with vacuum ultraviolet light in the same manner as for the test piece corresponding to the patterned fiber substrate of Example 1 except that the PET film was used instead of the PBT nonwoven fabric. The conductive ink same as that in Example 1 was applied to the substrate by a drop casting method, whereby the conductive ink was held only in the lyophilic region. Then, the fiber substrate was heated for drying the conductive ink and sintering the silver nanoparticles in the same manner as in Example 1 to give a substrate having a pattern with a size of 1 cm×9 cm. The patterned region (1 cm×9 cm) was cut out from the substrate to produce a test piece.

The longitudinal resistance (initial resistance value: $R_0 \Omega$) of each test piece produced as described above was measured. Then, both longitudinal ends of each test piece were fixed to the bending tester. Each test piece was continuously bent with a bending radius of 1.5 mm with its patterned surface facing its outside. The longitudinal resistance (RΩ) of each test piece after being bent 15,000 times, 20,000 times, and 30,000 times was measured, and each resistance deterioration rate a was calculated according to the following equation.

$$\alpha = (R/R_0) - 1 \qquad \text{[Equation 1]}$$

TABLE 1

| | Resistance deterioration rate α | | |
|---|---|---|---|
| | After 15,000 times of bending | After 20,000 times of bending | After 30,000 times of bending |
| Test piece corresponding to patterned fiber substrate of Example 1 | 0.15 | 0.15 | 0.15 |
| Test piece corresponding to patterned substrate of Comparative Example 2 | 0.18 | 0.24 | 0.25 |

[Comparison of Bending Resistance]

In the following, as for the bending resistance, test pieces of the patterned fiber substrate of Example 1 and the patterned substrate of Comparative Example 2 were produced and compared.

First, a test piece corresponding to the patterned fiber substrate of Example 1 was produced. Specifically, the same PBT nonwoven fabric as that used in Example 1 was used as a fiber substrate. The photomask from which a chromium thin film (1 cm×9 cm) near the center had been removed was placed on the PBT nonwoven fabric, and the PBT nonwoven fabric was irradiated with vacuum ultraviolet light (wavelength: 172 nm, integral light quantity: 1.63 J/cm²) from above the photomask while nitrogen was circulated at a flow rate of 19 L/min to form a lyophilic region on the fiber substrate and in the inside of the fiber substrate. The conductive ink same as that in Example 1 was applied to the fiber substrate by a drop casting method, whereby the conductive ink penetrated and was held only in the lyophilic region. Then, the fiber substrate was heated for drying the conductive ink and sintering the silver nanoparticles in the As for the test piece corresponding to the patterned fiber substrate of Example 1, the resistance deterioration rate did not increase even after the number of bending increased from 15,000. Meanwhile, as for the test piece corresponding to the patterned substrate of Comparative Example 2, the resistance deterioration rate increased as the number of bending increased.

As for the test piece corresponding to the patterned fiber substrate of Example 1, the resistance deterioration rate was 0.15 at the initial stage of the bending test (until the number of bending reached 15,000). This is probably due to falling of the silver nanoparticles that had not been fixed to the fibers inside the nonwoven fabric.

These results clarify that the patterned fiber substrate of the present invention has better bending resistance than the patterned substrate does. This is probably due to the following. Specifically, in the patterned fiber substrate, the conductive ink penetrates into the fiber substrate, and at least a part of the conductive material constituting the pattern is present in the inside of the fiber substrate (near the neutral plane in the bending), and therefore the conductive material is slightly strained at the time of bending. In contrast, in the patterned substrate, the conductive ink does not penetrate into the film substrate, and the conductive pattern is formed only on the film surface, and therefore the conductive pattern is greatly strained at the time of bending.

INDUSTRIAL APPLICABILITY

The patterned fiber substrate of the present invention can be produced by a simpler method using a wide range of functional material solutions or dispersions, can also have a fine pattern, and has excellent bending resistance. The patterned fiber substrate of the present invention as described above can be suitably used as a member that constitutes a textile product or a part thereof an electronic member, a member for a building or a structure, or an interior member for a building, a vehicle or the like.

DESCRIPTION OF REFERENCE SIGNS

1: Thickness of substrate
2: Depth of functional material present inside of substrate from surface of substrate
3: Functional material present on surface of substrate
4: Pattern
5: Conductive pattern (A)
6: Conductive pattern (B)
7: Conductive pattern electrically connecting conductive pattern (A) and conductive pattern (B) together
8: Patterned fiber substrate
9: Protective material
10: Adhesive layer
11: Electronic component

The invention claimed is:

1. A patterned fiber substrate comprising:
a fiber substrate; and
a pattern consisting of a functional material and formed on the fiber substrate,
wherein at least a part of the functional material that constitutes the pattern is present in inside of the fiber substrate,
the fiber substrate has a contact angle of 100 to 170° with pure water on its surface, and
the pattern has a narrowest line width of 1 to 3000 μm.

2. The patterned fiber substrate according to claim 1, wherein the fiber substrate has an air permeability of 400 cm$^3$/cm$^2$·s or less.

3. The patterned fiber substrate according to claim 1, wherein fibers that constitute the fiber substrate have an average fiber diameter of 0.1 to 20 μm.

4. The patterned fiber substrate according to claim 1, wherein the fiber substrate is a nonwoven fabric.

5. The patterned fiber substrate according to claim 1, wherein at least a part of the functional material that constitutes the pattern reaches a depth of 1 μm or more from a surface of the fiber substrate.

6. The patterned fiber substrate according to claim 1, wherein the fiber substrate has a double roughness structure on its surface.

7. The patterned fiber substrate according to claim 1, wherein the pattern is a conductive pattern.

8. The patterned fiber substrate according to claim 7, comprising two or more conductive patterns formed on one surface of the patterned fiber substrate, wherein at least two of the conductive patterns are electrically connected together by being partially in contact with each other or by another conductive pattern.

9. The patterned fiber substrate according to claim 7, comprising one or more conductive patterns (A) formed on one surface of the patterned fiber substrate, and one or more conductive patterns (B) formed on another surface of the patterned fiber substrate, wherein at least one of the conductive patterns (A) and at least one of the conductive patterns (B) are electrically connected together by being partially in contact with each other or by another conductive pattern.

10. A patterned fiber substrate laminate comprising a plurality of patterned fiber substrates,
wherein at least two of the plurality of patterned fiber substrates are each the patterned fiber substrate according to claim 7,
each of the at least two patterned fiber substrates includes one or more conductive patterns formed on one surface of the patterned fiber substrate, or one or more conductive patterns formed on each of both surfaces of the patterned fiber substrate, and
at least two conductive patterns included in separate patterned fiber substrates are electrically connected together by being partially in contact with each other or by another conductive pattern.

11. The patterned fiber substrate according to claim 1, comprising a protective material on at least a part of at least one surface of the patterned fiber substrate.

12. The patterned fiber substrate laminate according to claim 10, comprising a protective material on at least a part of at least one surface of the patterned fiber substrate laminate.

13. A method for producing the patterned fiber substrate according to claim 1, the method comprising:
(i) forming a lyophilic region on the fiber substrate and in the inside of the fiber substrate;
(ii) providing a solution or a dispersion of the functional material to the formed lyophilic region; and
(iii) removing a solvent or a dispersion medium from the provided solution or dispersion.

14. The production method according to claim 13, wherein in (i), the lyophilic region is formed by irradiating outside of the fiber substrate and the inside of the fiber substrate with ultraviolet light.

15. The production method according to claim 13, wherein in (i), the lyophilic region is formed on the fiber substrate that is not subjected to a liquid repellent treatment and in the inside of the fiber substrate that is not subjected to a liquid repellent treatment.

16. The production method according to claim 13, further comprising:
(iv) forming a protective material on at least a part of at least one surface of the patterned fiber substrate obtained in (iii).

17. The production method according to claim 16, wherein in (iv), the protective material is formed by bonding of the protective material in sheet shape to the patterned fiber substrate, applying or electrodepositing a solution or a dispersion of the protective material to the patterned fiber substrate, and subsequently removing a solvent or a dispersion medium, or dipping the patterned fiber substrate into a solution or a dispersion of the protective material, and subsequently removing a solvent or a dispersion medium.

\* \* \* \* \*